United States Patent [19]
Buch et al.

[11] Patent Number: 6,070,260
[45] Date of Patent: May 30, 2000

[54] TEST METHODOLOGY BASED ON MULTIPLE SKEWED SCAN CLOCKS

[75] Inventors: Kiran B. Buch, Fremont; Mehul R. Vashi, Santa Clara, both of Calif.

[73] Assignee: Xilinx, Inc., San Jose, Calif.

[21] Appl. No.: 09/156,534

[22] Filed: Sep. 17, 1998

[51] Int. Cl.$^7$ .................................................. G01R 31/28
[52] U.S. Cl. .......................... 714/731; 714/724; 714/726
[58] Field of Search .................................... 714/731, 724, 714/726

[56] References Cited

U.S. PATENT DOCUMENTS

| | | | |
|---|---|---|---|
| 5,848,075 | 12/1998 | Katayama et al. | 714/726 |
| 5,864,564 | 1/1999 | Levitt et al. | 327/156 |
| 5,875,153 | 2/1999 | Hii et al. | 365/233 |

*Primary Examiner*—Phung M. Chung
*Attorney, Agent, or Firm*—Adam H. Tachner, Esq.; Crosby, Heafey, Roach & May; Lois D. Cartier

[57] ABSTRACT

A method is provided for scan testing that eliminates the need for balancing internal scan clock delays. According to the method of the invention, multiple scan clocks are provided, each being provided to a different set of flip-flops. The skew between the active edges of the scan clocks is deliberately increased to the point where each set of flip-flops has plenty of time to settle before the next set of flip-flops receives a clock pulse. Because scan testing is typically performed at clock speeds of only about 1 Megahertz, there is time for each of the scan clocks to pulse separately from all the others, without increasing the test time. The increased delay between scan clock pulses eliminates the need for balancing internal delays on the scan clock paths, thereby greatly reducing the number of placement and routing iterations required to achieve a functional design.

20 Claims, 6 Drawing Sheets

TEST METHODOLOGY BASED ON MULTIPLE SKEWED SCAN CLOCKS

FIELD OF THE INVENTION

The present invention relates generally to the field of scan testing of programmable integrated circuits (ICs). More particularly, the invention relates to clock signals provided from external package pins to clock pins of scan registers within a programmable IC.

BACKGROUND OF THE INVENTION

The use of scan test methodology requires the control of clock pins on scan registers within the programmable IC from external package pins. (Scan test methodology is well known in the art and therefore is not described in detail herein. The term "programmable IC" as used herein includes but is not limited to FPGAs, mask programmable devices such as Application Specific ICs (ASICs), Programmable Logic Devices (PLDs), and devices in which only a portion of the logic is programmable.) If the design implemented in the programmable IC contains internally generated clocks, multiplexers (MUXes) are added to disable the internally generated clocks and feed the scan test clock to the scan registers during testing. The addition of MUXes and scan clock skew caused by different routing delays makes it difficult to clock all the scan registers in a synchronized manner. "Clock skew" is defined as the maximum time difference between arrival times of a clock edge at clock pins of multiple registers. As a result of clock skew, a transition in one register can occur within the set-up or hold time window of another register, thereby causing timing errors.

The terms "set-up time" and "hold time" describe the timing requirements on the data input signal of a flip-flop or register with respect to the clock input signal. The set-up time is the amount of time that the input data must be present at the data pin of the register prior to an active clock edge. The hold time is the amount of time that the input data must remain at the data pin of the register after the active clock edge. Therefore, the set-up and hold times describe a window of time during which data must be stable in order to guarantee predictable performance over the full range of operating conditions and manufacturing tolerances.

Test vectors for an IC are usually generated using an automated test pattern generator (ATPG) tool. Currently available ATPG tools assume an ideal clock, i.e., they assume there is no clock skew on the scan test clock. Therefore, typically the only way to make the test vectors simulate and function correctly on the tester is to reduce the clock skew by iterative placement, routing, and back annotated simulation. In other words, the design must be implemented many times in an attempt to find one implementation with sufficiently small clock skew that the scan testing functions correctly. This process can be very time consuming for an IC of even moderate complexity, causing long delays in the design cycle.

Figure 1A:
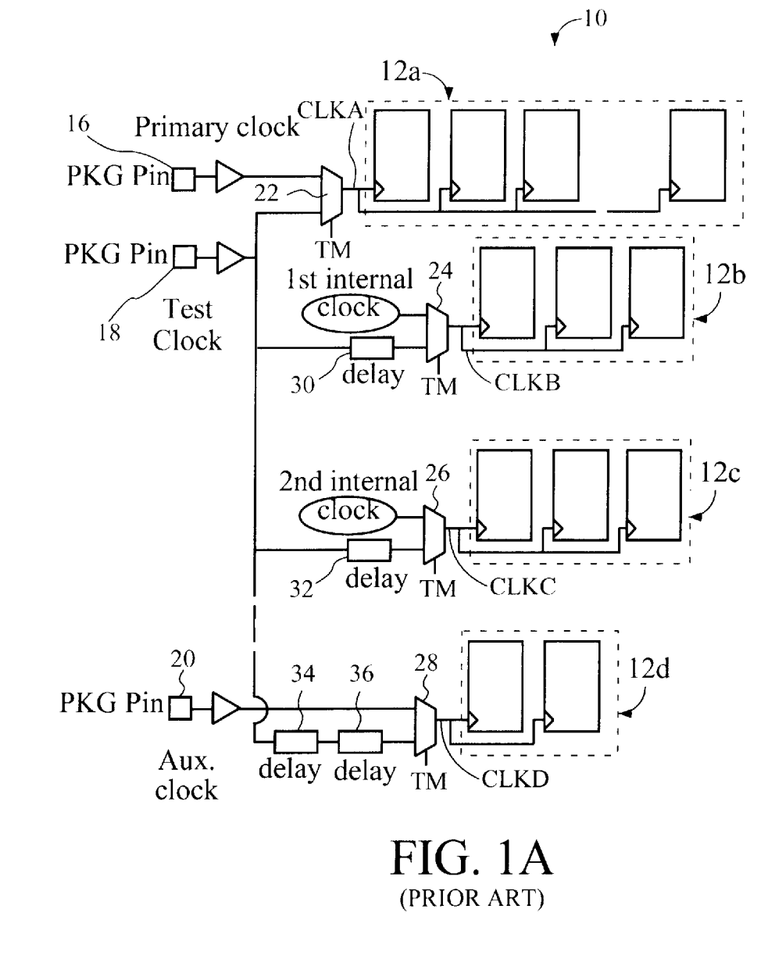
FIG. 1A is a block diagram of a circuit commonly used in programmable IC scan logic, wherein various clock signals are applied in a conventional manner.

FIG. 1A shows an example of the circuit typically used in programmable IC scan logic. The scan circuit 10 includes a plurality of registers 12a, 12b, 12c, and 12d typically comprising variously sized sets of flip-flops (as shown) as well as other logic elements (not shown). Clock signals CLKA, CLKB, CLKC, and CLKD are separately applied to registers 12a–12d, respectively.

Under ordinary operating conditions (i.e., in user mode), a package pin 16 (i.e., a pin external to the IC package) is supplied with an externally generated primary clock signal, which is applied through a MUX 22 to register 12a as the clock signal CLKA. During scan testing, however, an externally generated test clock is applied to a package pin 18 which is connected through MUX 22 to register 12a. The test clock is also supplied from package pin 18 through an optional delay element 30 and a MUX 24 to register 12b, and also through an optional delay element 32 and a MUX 26 to register 12c. The test clock is further supplied from package pin 18 through two optional delay elements 34, 36 in series and a MUX 28 to the flip-flop set 12d. These and other delay elements in FIG. 1A represent the routing delays on the scan clock path resulting, for example, from the placement and routing of a design in a programmable IC. Delay elements may also be included in the form of buffers or delay cells.

Also, a first internally generated clock (internal clock) is applied through MUX 24 to register 12b, a second internal clock is applied through MUX 26 to register 12c, and an externally generated auxiliary clock (Aux. clock) supplied at package pin 20 is applied through MUX 28 to register 12d.

Under scan test conditions (i.e., in test mode), MUXes 22, 24, 26, 28 are supplied with a test mode control signal TM that causes the primary clock, the internal clocks, and the auxiliary clock to be disconnected from registers 12a–12d, and the test clock to be connected to registers 12a–12d.

Since the number of flip-flops in each of registers 12a–12d may be different, the loading on each of clock signals CLKA-CLKD may also be different. This difference in loading coupled with differences in routing delays causes the arrival time of the test clock signal applied to package pin 18 to be different for each of registers 12a–12d. The presence of delay elements 30, 32, 34, and 36 demonstrates an attempt to balance the delay on the clock paths. The values of these delay elements are typically iteratively adjusted to make the arrival time of CLKA-CLKD the same for each register. The ideal test vectors generated by the ATPG tools assume equal total delay on each of the various paths from the test clock pin to the registers.

Figure 1B:
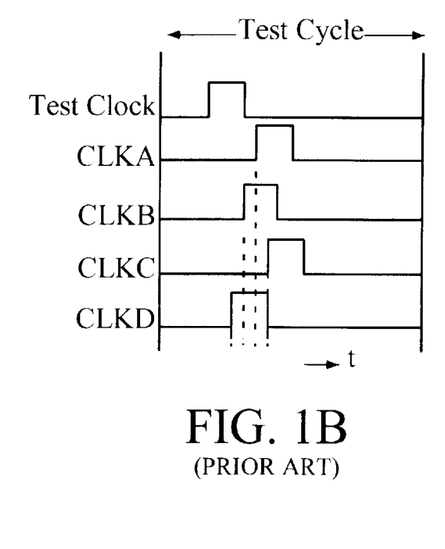
FIG. 1B is a timing diagram showing the relative skews of the various clock signals in the circuit of FIG. 1A.

FIG. 1B shows a timing diagram for scan circuit 10 of FIG. 1A. Clearly, for a given Test Clock pulse applied to external pin 18, the actual arrival time of the clock pulse to destination flip-flops clocked by clock signals CLKA, CLKB, CLKC, and CLKD are different. This result is due to inter-clock skew caused by variable loading and differences in routing delays.

Figure 2:
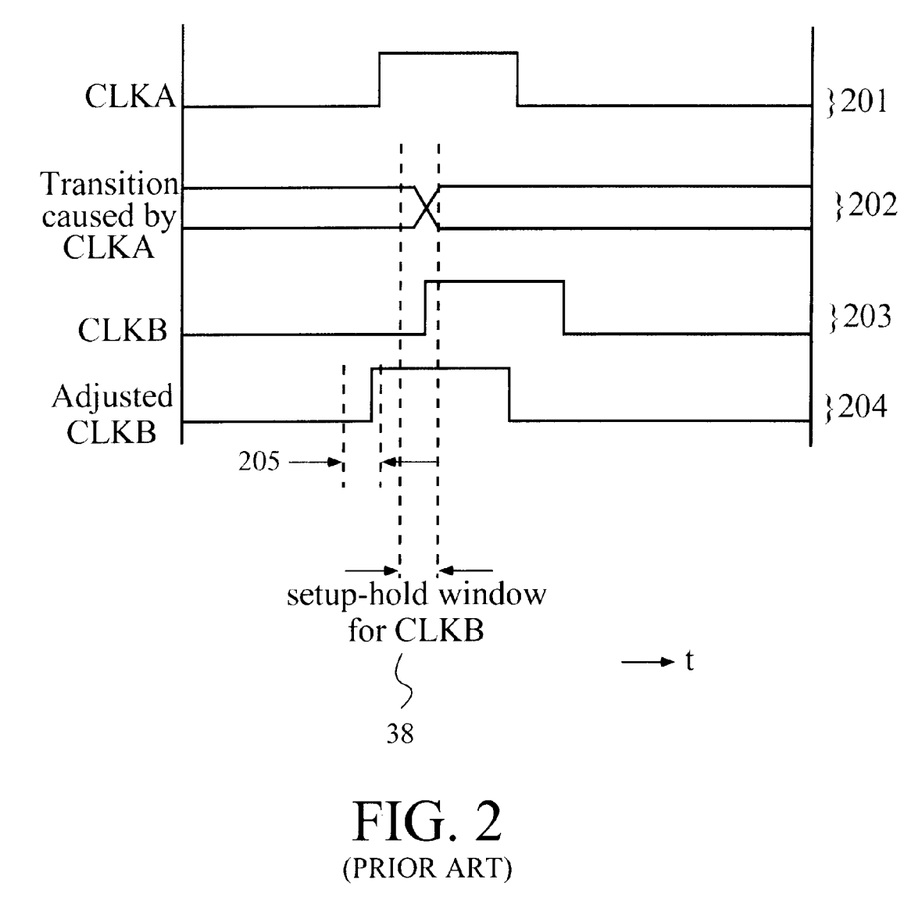
FIG. 2 is a timing diagram showing clock skew as it affects the set-up and hold window of clock signal CLKB.

FIG. 2 is a timing diagram that shows how these differing delays can cause set-up and hold violations. Trace 201 shows a clock pulse at the clock pin of register 12a(CLKA). Trace 202 shows the transition on the output signal from register 12a. Note that there is a delay (the delay through one flip-flop, in this case) between the rising edge of clock signal CLKA and the transition in trace 202. Vertical dashed lines 38 define the set-up and hold window for register 12b (clocked by clock signal CLKB, trace 203). Trace 202 shows that the transition caused by clock signal CLKA falls inside the set-up and hold window 38 for the register clocked by clock signal CLKB, due to skew between clock signals CLKA and CLKB. This transition therefore causes a timing error whenever a signal driven by register 12a provides data to register 12b. The timing error may cause erroneous data to be captured by register 12b. Such timing errors are typically reported when ATPG vectors are simulated using a simulation tool. These timing errors must each be carefully evaluated to determine the cause, and the circuit must be adjusted to eliminate the errors.

Conventionally, a timing error is fixed by eliminating the skew between clock signals CLKA and CLKB by changing the values of the delay elements, which involves the time-consuming process of iterating the placement and routing process until satisfactory delays are achieved. Trace 204 of FIG. 2 shows an adjusted CLKB clock pulse, where appropriate delays have been inserted in the clock paths to balance the delays between CLKA and CLKB. Note that the transition caused by CLKA is now outside of set-up and hold window 205 for adjusted CLKB. This "trial and error" method is inefficient. Therefore, it is desirable to provide a method for scan testing that eliminates timing errors without iterative placement and routing.

SUMMARY OF THE INVENTION

The invention provides a method for scan testing that eliminates the need for balancing internal scan clock delays. According to the method of the invention, multiple scan clocks are provided, each being provided to a different set of flip-flops (i.e., to a different register). The skew between the active edges of the scan clocks is deliberately increased to the point where each set of flip-flops has plenty of time to settle before the next set of flip-flops receives a clock pulse. In other words, instead of trying to make the clock pulses coincide, the pulses are deliberately separated. Because scan testing is typically performed at clock speeds of only about 1 Megahertz, there is time for each of the scan clocks to pulse separately from all the others, and the test time is not increased. The increased delay between scan clock pulses eliminates the need for balancing internal delays on the scan clock paths, thereby greatly reducing the number of placement and routing iterations required to achieve a functional design.

According to one embodiment of the invention, a plurality of package pins are provided, each package pin supplying a different scan clock driving a different set of flip-flops. The scan clocks on the different package pins are deliberately skewed in such a fashion as to permit each set of flip-flops to settle before the next set of flip-flops receives a clock pulse. In this embodiment, the expected values provided by the ATPG tools (i.e., the data provided to be compared with data read from the chip) accurately predict the behavior of the device. Available ATPG tools permit the specification of multiple input clock pins and the relative offsets of the corresponding signals. Therefore, available ATPG tools are fully compatible with this embodiment. This embodiment can be effectively used if the design contains multiple externally supplied scan clocks and no internally generated scan clock signals.

According to another embodiment of the invention, the multiple scan clocks are generated on the device from a single scan clock provided to a single package pin. However, the method of the invention provides for the insertion of internal delay elements for a different purpose than those previously used. As with the previous embodiment, the delays are large enough to permit each set of flip-flops to settle before the next set of flip-flops receives a clock pulse.

Because the ATPG tools are ignorant of all delays internal to the device under test (DUT), the ATPG tools cannot accurately predict the behavior of a DUT when this embodiment of the invention is used. Therefore, in this embodiment, the device is simulated prior to testing, to determine the correct output data. (Note that a simulator predicts the behavior of a good device, not that of a faulty device. Therefore, the simulator produces the correct expected output data.) The ATPG test vectors are preferably used as the simulation input data. The output data from the simulation run are then used to perform scan testing on all future devices having the same implementation.

These two embodiments, utilizing the external and internal deliberate separation of clock edges, can also be combined in the simulation and testing of a single device.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

First Embodiment

Figure 3A:
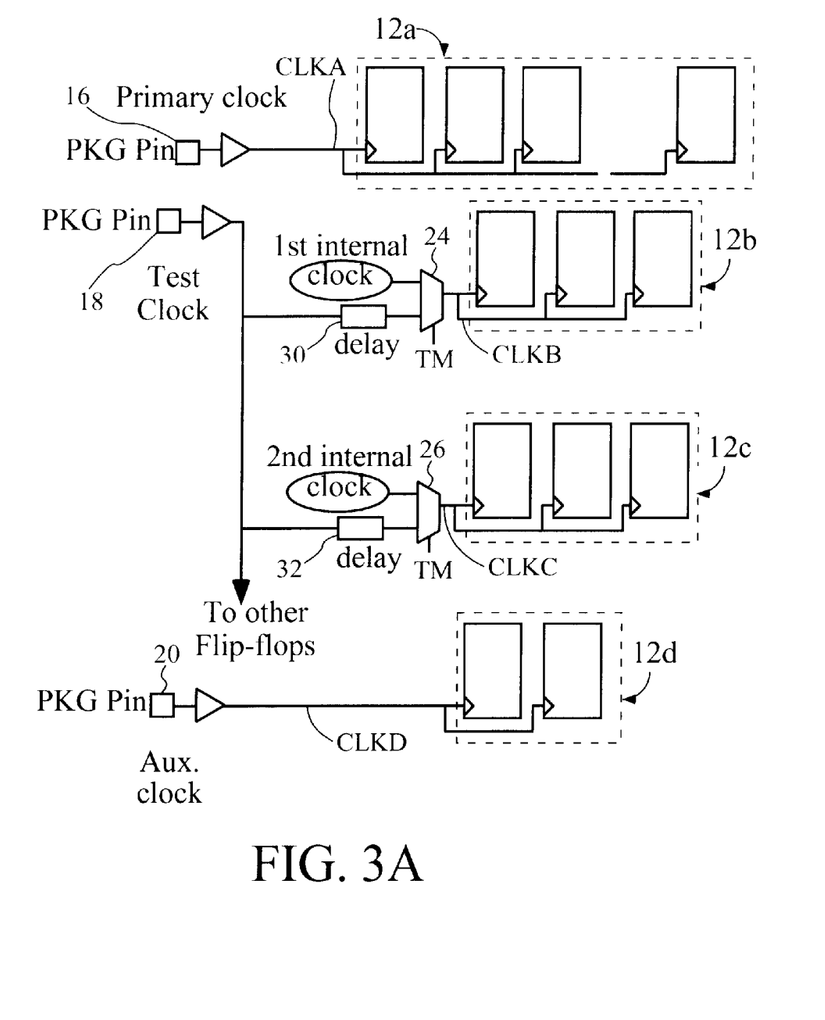
FIG. 3A is a block diagram of a circuit used in a first embodiment of the invention.

FIG. 3A shows a circuit used in a first embodiment of the invention. The same elements of the circuit of FIG. 1A are assigned the same corresponding reference numerals and the descriptions of their functions is not repeated. In the arrangement of FIG. 3A, since clock signals CLKA and CLKD are accessible from package pins 16 and 20, respectively, they are used as scan test clock signals as well as user clock signals. Further, MUXes 22 and 28 are now unnecessary and are omitted from the paths of clock signals CLKA and CLKD, respectively, to improve the pin-to-clock delay in the user mode.

When in test mode, clock signals CLKA and CLKD are used as separate scan test clocks and are shifted both with respect to each other and with respect to a test clock applied to package pin 18. This shift is sufficiently large that transitions caused by clock signals CLKA and CLKD are outside of setup and hold window 38 of clock signal CLKB and a similar setup and hold window of clock signal CLKC, thereby eliminating timing errors. This approach simplifies the design process, because delay elements 34 and 36 are eliminated. As described above, these multiple clocks and their relative offsets can be generated by traditional ATPG tools.

However, since clock signals CLKB and CLKC are internal clocks generated in test mode as a function of the signal on package pin 18 (e.g., by a frequency divider), they are still controlled by the test clock and may have clock skew relative to each other. Therefore, at least one of delay elements 30 and 32 may still be necessary to compensate for clock skew. The test clock signal from package pin 18 may also drive additional sets flip-flops, for which delays must also be determined. The election of the proper delay values is still a time-consuming, iterative process during the design phase of implementing a design in a programmable IC.

FIG. 3A shows that the method of the invention, although it can be used alone, can also be combined with prior art methods for scan testing. Even in combination with prior art methods, however, the method of the invention can substantially reduce the design cycle time.

Figure 3B:
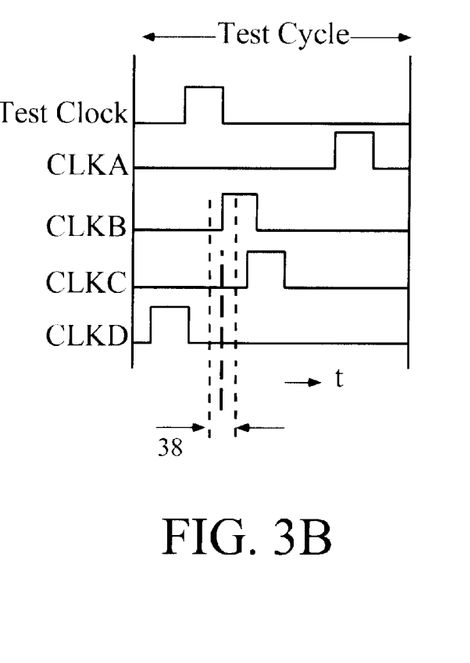
FIG. 3B is a timing diagram showing the relative skews of the various clock signals in the circuit of FIG. 3A.

FIG. 3B shows a timing diagram for the circuit of FIG. 3A. Comparing FIGS. 3B and 1B, note that the test clock, clock signal CLKA, and clock signal CLKD are shifted relative to each other and to clock signals CLKB and CLKC, so that transitions caused by clock signals CLKA and CLKD are well outside of the setup and hold windows of clock signals CLKB and CLKC. Also note the skew between clock signals CLKB and CLKC, which is caused by variable loading and routing delays.

Figure 4:
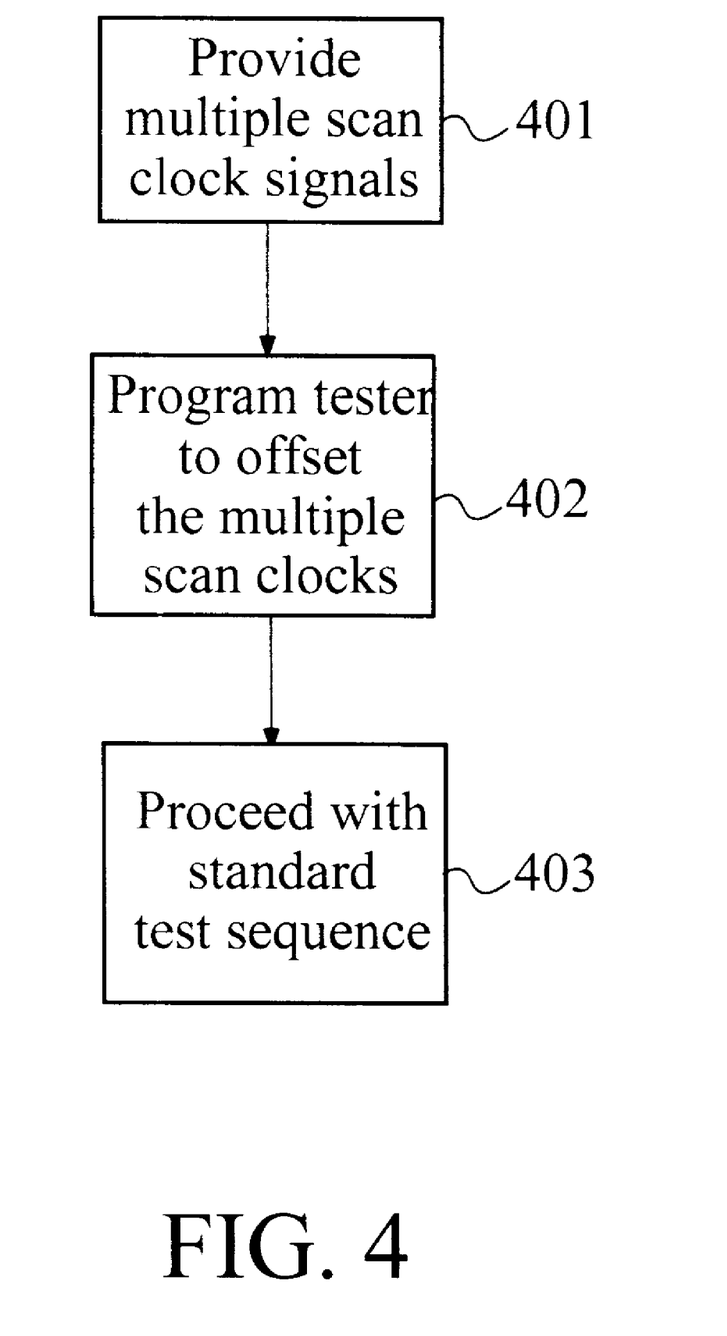
FIG. 4 is a flow chart showing the steps followed in the embodiment of FIGS. 3A and 3B.

FIG. 4 is a flow diagram for the method of the invention as applied to the circuit of FIGS. 3A and 3B. In step 401, multiple scan clock signals are supplied to a plurality of package pins. In step 402, the necessary information is provided to the tester to enable the tester to offset the clocks from each other. Each relative offset is sufficient to allow a first set of flip-flops to change values, to route the new values to a second set of flip-flops, and to accommodate the setup time at the second set of flip-flops. Therefore, the relative offsets eliminate timing errors that would otherwise occur. In step 403, the standard test sequence is performed, with the output data from the device under test being compared to the expected output data generated by the ATPG tools. This step may include some iterative placement and routing of the design to achieve balanced internal delays for scan clocks supplied by the same package pin.

Second Embodiment

Figure 5A:
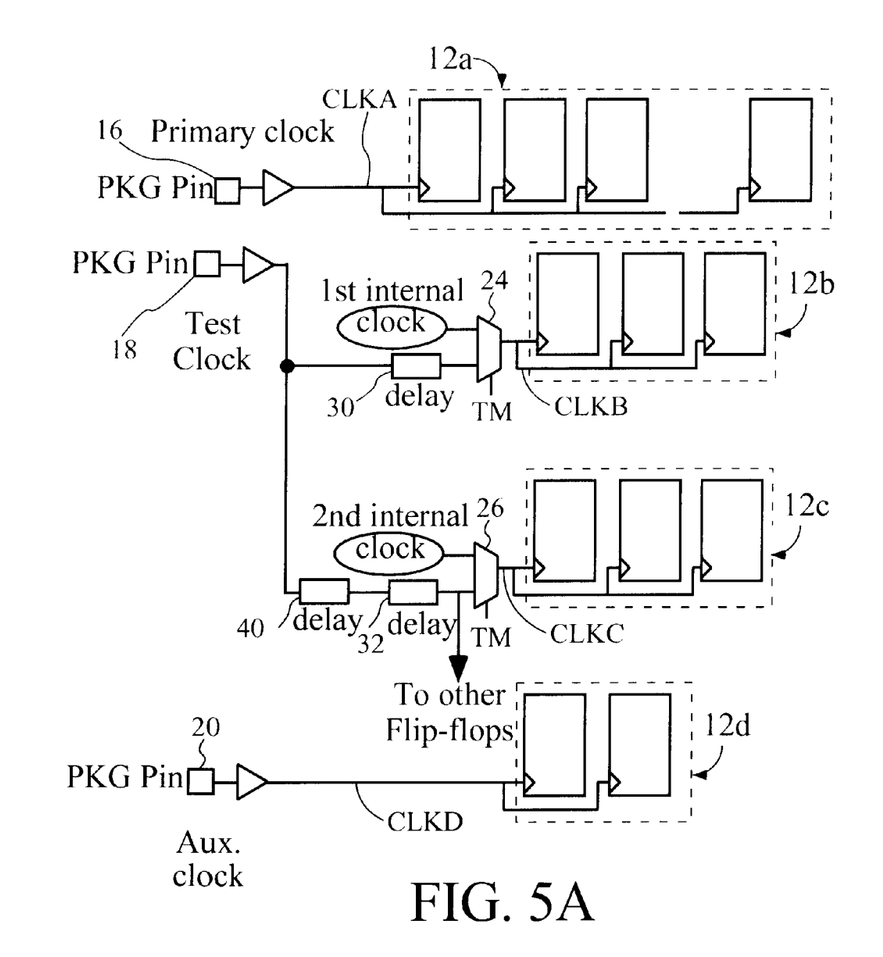
FIG. 5A is a block diagram of a circuit used in a second embodiment of the invention.

FIG. 5A shows a circuit used with a second embodiment of the invention. The circuit of FIG. 5A is similar to that of FIG. 3A. Again, MUXes 22 and 28 are eliminated, along with delay elements 34 and 36. Clock signals CLKA and CLKD are controlled from package pins 16 and 20, respectively, both in user mode and test mode. In test mode, clock signals CLKA and CLKD are offset with respect both to the test clock applied to package pin 18 and to each other. However, in this embodiment, instead of trying to eliminate skew between clock signals CLKB and CLKC by balancing internal delays on the scan clock paths, more skew is deliberately introduced between clock signals CLKB and CLKC. This additional skew moves the transitions caused by clock signal CLKC to be outside the setup and hold window of clock signal CLKB, as well as the setup and hold windows of clock signals CLKA and CLKD, thus eliminating timing errors. Skew is deliberately introduced by 1) omitting delay element 30 on the CLKB path; and 2) adding delay element 40 in series with delay element 32 on the CLKC path prior to MUX 26. Therefore, the test clock is delayed by the values of these delay elements before being received by register 12c. Note that the delayed clock signal (e.g., from delay element 32, as shown, or from delay element 40) can now be used to drive another set of flip-flops, thereby cascading the delays and separating each of the resulting clock signals from the other clock signals driven by the test clock on package pin 18.

In one embodiment, clock signals CLKA and CLKD are also offset to ensure that no timing error occurs between CLKB and either of clock signals CLKA and CLKD.

Figure 5B:
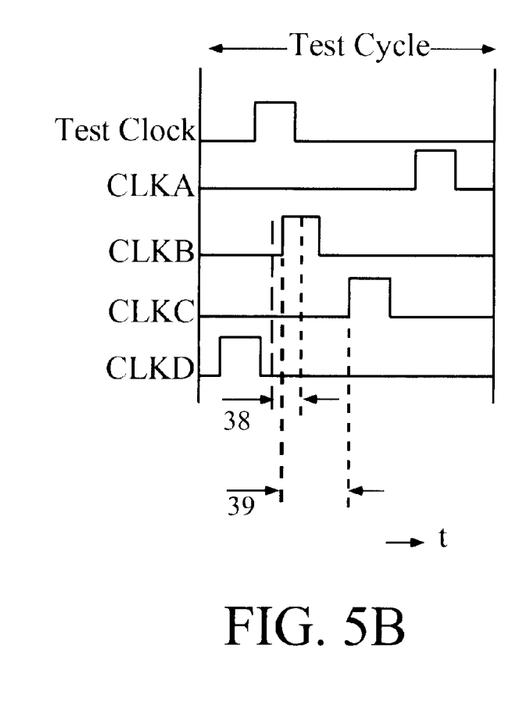
FIG. 5B is a waveform diagram showing the relative skews of the various clock signals in the circuit of FIG. 5A.

FIG. 5B shows a timing diagram for the circuit of FIG. 5A. Comparing FIGS. 5B and 3B, note that the test clock is unchanged and CLKA and CLKD are unchanged. However, clock signal CLKB occurs slightly earlier in FIG. 5B, and clock signal CLKC is further delayed, these changes combining to create an offset 39 between clock signals CLKB and CLKC.

Figure 6:
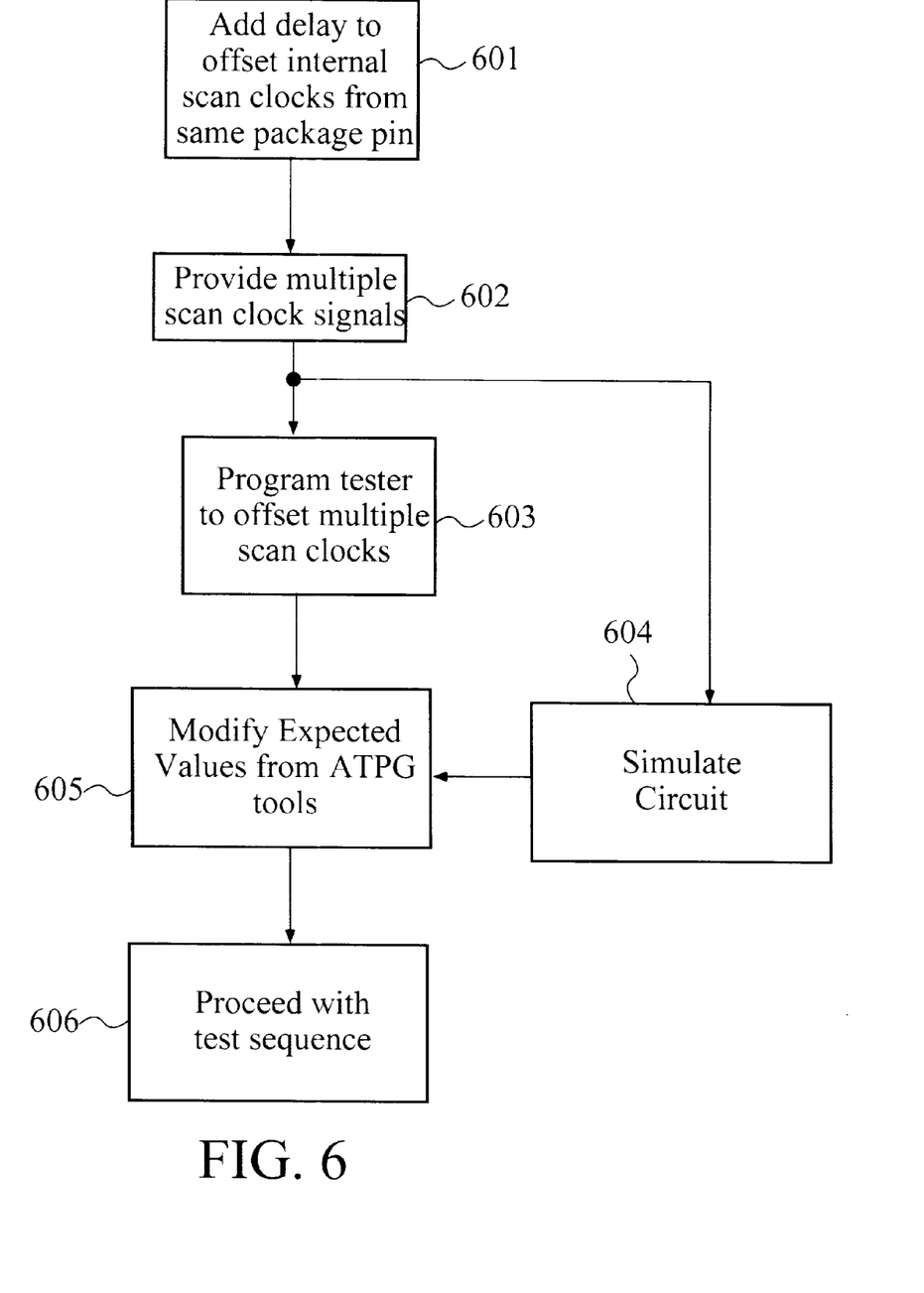
FIG. 6 is a flow chart showing the steps followed in the embodiment of FIGS. 5A and 5B.

FIG. 6 is a flow diagram for the method of the invention as applied to the circuit of FIGS. 5A and 5B. In step 601, additional delay is added to the internal scan clock paths to provide a larger offset on these internal signals. This relative offset is large enough to eliminate timing errors. In step 602, multiple scan clock signals are supplied to a plurality of package pins. In step 603, the necessary information is provided to the tester to enable the tester to offset the clocks on these package pins both from each other and from the internal scan clocks of step 601. Each relative offset is sufficient to eliminate timing errors.

In this second embodiment, the skew compensation techniques in step 601 cause the scan output data to be different from those predicted by the ATPG tools. (To the ATPG tools, there is no such thing as internal delay for the design.) Therefore, in step 604, the modified design (including the deliberately inserted delays) is simulated to generate a list of output values that correspond to a correctly functioning device. In step 605, these output values are incorporated into the test vectors generated by the ATPG tools. The new test vectors use the input data generated by the ATPG tools and the output data generated by the simulator. In step 606, the test sequence is performed using these modified test vectors.

Third Embodiment

A third embodiment (not shown) is similar to that of FIGS. 5A, 5B, and 6, except that clock signals CLKA and CLKD and the associated logic is not included. Therefore, all flip-flops are driven from a single package pin such as pin 18. The flow chart for this embodiment is the same as FIG. 6 with steps 602 and 603 eliminated. However, this embodiment still differs from prior art scan test methods in that the scan clocks are deliberately "unbalanced" internally to increase skew, rather than being balanced to minimize skew. As with the previous embodiment, the ATPG vectors must be modified to substitute simulation output values for ATPG-generated expected output values.

Those having skill in the relevant arts of the invention will now perceive various modifications and additions that may be made as a result of the disclosure herein. For example, the above text describes the invention in the context of programmable ICs. However, the invention can also be applied to other integrated circuits. Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art. Accordingly, all such modifications and additions are deemed to be within the scope of the invention, which is to be limited only by the appended claims and their equivalents.

What is claimed is:

1. A method of scan testing a plurality of sets of logic elements within an integrated circuit, each set of logic elements having one or more clock terminals all driven by a given clock signal, each clock signal being coupled to a different one of a plurality of package pins, each set of logic elements having one or more data input terminals and providing one or more output signals, each set of logic elements having setup and hold requirements, the method comprising:

applying two or more clock signals to the plurality of package pins;

offsetting the clock signals from each other sufficiently to cause the output signals of a first set of logic elements, when routed to the data input terminals of a second set of logic elements, not to violate the setup and hold requirements of the second set of logic elements; and applying a sequence of test vectors to the integrated circuit.

2. The method of claim 1, wherein the sequence of test vectors applied to the integrated circuit is generated using an automated test program generator (ATPG).

3. The method of claim 1, wherein at least some of the clock signals are offset from each other external to the integrated circuit by programming a tester.

4. The method of claim 1, wherein at least some of the clock signals are offset from each other by introducing a relative clock signal delay within the integrated circuit between clock signals applied to different sets of logic elements.

5. The method of claim 4, wherein at least some of the clock signals are offset fro each other external to the integrated circuit by programming a tester.

6. The method of claim 4, wherein the sequence of test vectors applied to the integrated circuit is generated using an automated test program generator (ATPG) and then modified by substituting output values derived from simulation for ATPG expected output values.

7. The method of claim 1, wherein the integrated circuit is a programmable IC.

8. A method of scan testing a plurality of sets of logic elements within an integrated circuit, each set of logic elements having one or more clock terminals all driven by a given internal clock signal, each internal clock signal being coupled to the same package pin, each set of logic elements having one or more data input terminals and providing one or more output signals, each set of logic elements having setup and hold requirements, the method comprising:

applying a clock signal to the package pin;

offsetting the clock signals from each other by introducing a relative clock signal delay within the integrated circuit between different internal clock signals, the offset being sufficient to cause the output signals of a first set of logic elements, when routed to the data input terminals of a second set of logic elements, not to violate the setup and hold requirements of the second set of logic elements; and applying a sequence of test vectors to the integrated circuit.

9. The method of claim 8, wherein the sequence of test vectors applied to the integrated circuit is generated using an automated test program generator (ATPG) and then modified by substituting output values derived from simulation for ATPG expected output values.

10. The method of claim 8, wherein the integrated circuit is a programmable IC.

11. An apparatus for scan testing a plurality of sets of logic elements within an integrated circuit, each set of logic elements having one or more clock terminals all driven by a given clock signal, each clock signal being coupled to a different one of a plurality of package pins, each set of logic elements having one or more data input terminals and providing one or more output signals, each set of logic elements having setup and hold requirements, the apparatus comprising:

means for applying two or more clock signals to the plurality of package pins;

means for offsetting the clock signals from each other sufficiently to cause the output signals of a first set of logic elements, when routed to the data input terminals of a second set of logic elements, not to violate the setup and hold requirements of the second set of logic elements; and means for applying a sequence of test vectors to the integrated circuit.

12. The apparatus of claim 11, wherein the sequence of test vectors applied to the integrated circuit is generated using an automated test program generator (ATPG).

13. The apparatus of claim 11, wherein at least some of the clock signals are offset from each other external to the integrated circuit by programming a tester.

14. The apparatus of claim 11, wherein at least some of the clock signals are offset from each other by introducing a relative clock signal delay within the integrated circuit between clock signals applied to different sets of logic elements.

15. The apparatus of claim 14, wherein at least some of the clock signals are offset from each other external to the integrated circuit by programming a tester.

16. The apparatus of claim 14, wherein the sequence of test vectors applied to the integrated circuit is generated using an automated test program generator (ATPG) and then modified by substituting output values derived from simulation for ATPG expected output values.

17. The apparatus of claim 11, wherein the integrated circuit is a programmable IC.

18. An apparatus for scan testing a plurality of sets of logic elements within an integrated circuit, each set of logic elements having one or more clock terminals all driven by a given internal clock signal, each internal clock signal being coupled to the same package pin, each set of logic elements having one or more data input terminals and providing one or more output signals, each set of logic elements having setup and hold requirements, the apparatus comprising:

means for applying a clock signal to the package pin;

means for offsetting the clock signals from each other by introducing a relative clock signal delay within the integrated circuit between different internal clock signals, the offset being sufficient to cause the output signals of a first set of logic elements, when routed to the data input terminals of a second set of logic elements, not to violate the setup and hold requirements of the second set of logic elements; and means for applying a sequence of test vectors to the integrated circuit.

19. The apparatus of claim 18, wherein the sequence of test vectors applied to the integrated circuit is generated using an automated test program generator (ATPG) and then modified by substituting output values derived from simulation for ATPG expected output values.

20. The apparatus of claim 18, wherein the integrated circuit is a programmable IC.

* * * * *